United States Patent [19]

Nishizawa

[11] 4,347,097

[45] Aug. 31, 1982

[54] METHOD AND APPARATUS FOR PRODUCING A MULTILAYER SEMICONDUCTOR DEVICE UTILIZING LIQUID GROWTH

[75] Inventor: Jun-ichi Nishizawa, Sendai, Japan

[73] Assignee: Handotai Kenkyu Shinkokou, Sendai, Japan

[21] Appl. No.: 177,864

[22] Filed: Aug. 14, 1980

Related U.S. Application Data

[63] Continuation of Ser. No. 862,998, Dec. 21, 1977, abandoned, which is a continuation-in-part of Ser. No. 561,092, Mar. 24, 1975, abandoned, which is a continuation-in-part of Ser. No. 314,448, Dec. 12, 1972, abandoned.

[30] Foreign Application Priority Data

Dec. 14, 1971 [JP]  Japan .............................. 46-100622
Dec. 13, 1972 [DE]  Fed. Rep. of Germany ....... 2260980
Dec. 13, 1972 [GB]  United Kingdom ............... 57380/72

[51] Int. Cl.$^3$ ............................................ C30B 19/06
[52] U.S. Cl. .................................... 156/622; 422/253
[58] Field of Search ................ 156/622; 148/171, 172; 118/412, 415, 407, 422; 422/247, 245, 253; 427/85, 86

[56] References Cited

U.S. PATENT DOCUMENTS

| | | | |
|---|---|---|---|
| 3,665,888 | 5/1972 | Bergh et al. | 156/622 |
| 3,690,965 | 9/1972 | Bergh et al. | 156/622 |
| 3,692,592 | 9/1972 | Marinelli | 156/622 |
| 3,809,584 | 5/1974 | Akai et al. | 156/622 |
| 3,897,281 | 7/1975 | Gilbert et al. | 156/622 |

OTHER PUBLICATIONS

Journal of Crystal Growth 6, 1970, pp. 228-236, Minden.
Panish et al., "Double-Heterostructure Injection Lasers with Room Temperature Thresholds as Low as 2300 A/cm$^2$", Applied Physics Letters, vol. 16, No. 8, Apr. 1970, pp. 326, 327.
Denki Gakki Zasshi (literally: Electric Society Magazine), vol. 89 (11), pp. 2042-2051, 11/69.

Primary Examiner—Hiram Bernstein
Attorney, Agent, or Firm—Cushman, Darby & Cushman

[57] ABSTRACT

A method for performing successive mass production of identical semiconductor devices each having a multilayer structure consisting of a plurality of epitaxial layers successively deposited on a substrate without requiring, for each deposition, any steps of cooling and reheating a boat provided with a plurality of wells each containing a solution therein. An upper portion of each well is maintained at a predetermined temperature higher than that of a lower portion of the well which communicates with the upper portion so as to establish a constant temperature difference between the upper portion and the lower portion during the deposition of the epitaxial layers. A semiconductive solute material is soaked in the solution contained in the well to maintain the solution at a saturated concentration in the upper portion of the well and at a supersaturated concentration in the lower portion thereof. Movable slider means carrying thereon a plurality of substrates is successively moved to establish abutment of the lower portion of the well and either any one of the substrates arriving at the delivery end of the lower portion of the well for the deposition of the contents of the well onto the substrate to form an epitaxial layer thereon. Apparatus for practicing the method stated above is also disclosed.

27 Claims, 13 Drawing Figures

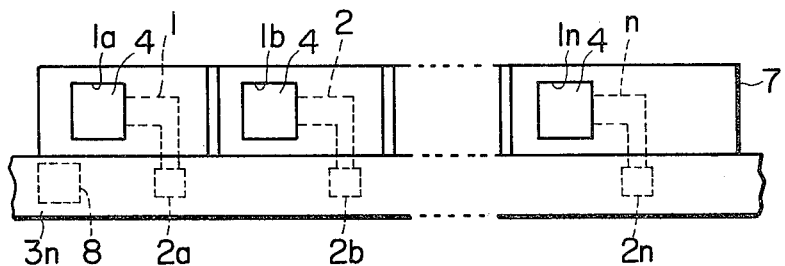
FIG. 1A
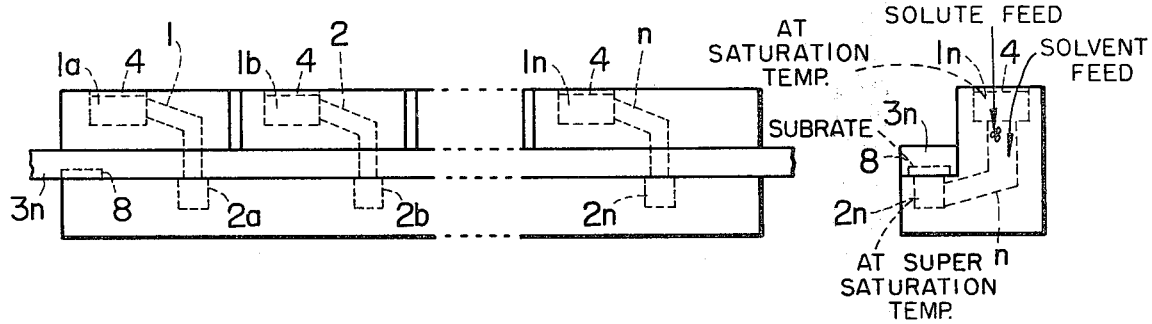
FIG. 1B
FIG. 1C
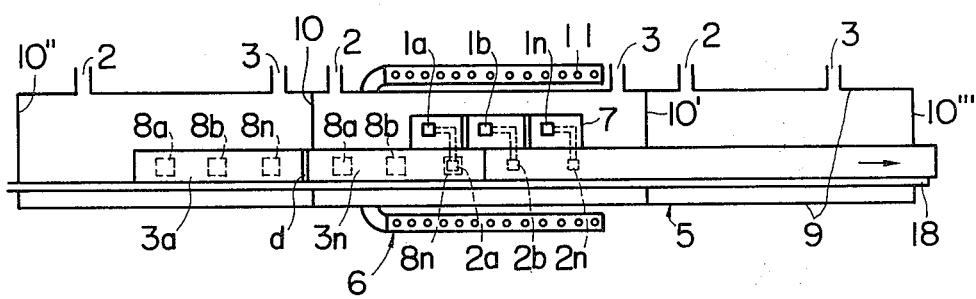
FIG. 2A
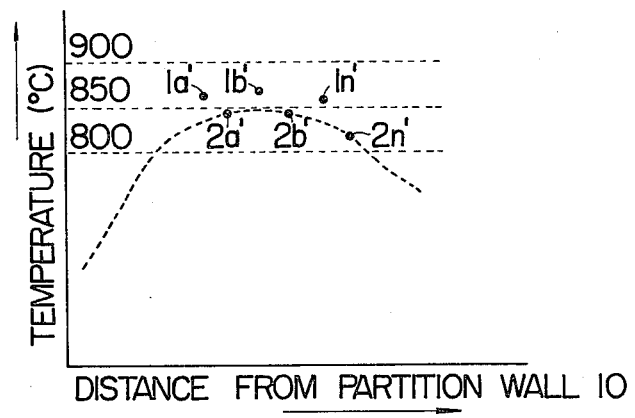
FIG. 2B

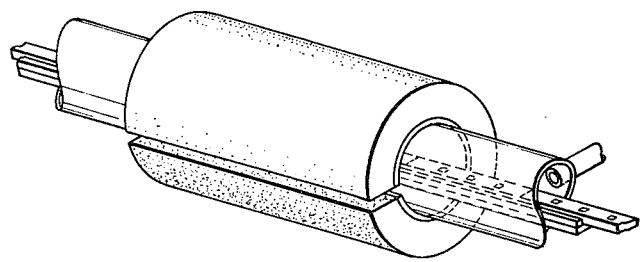
FIG. 2C
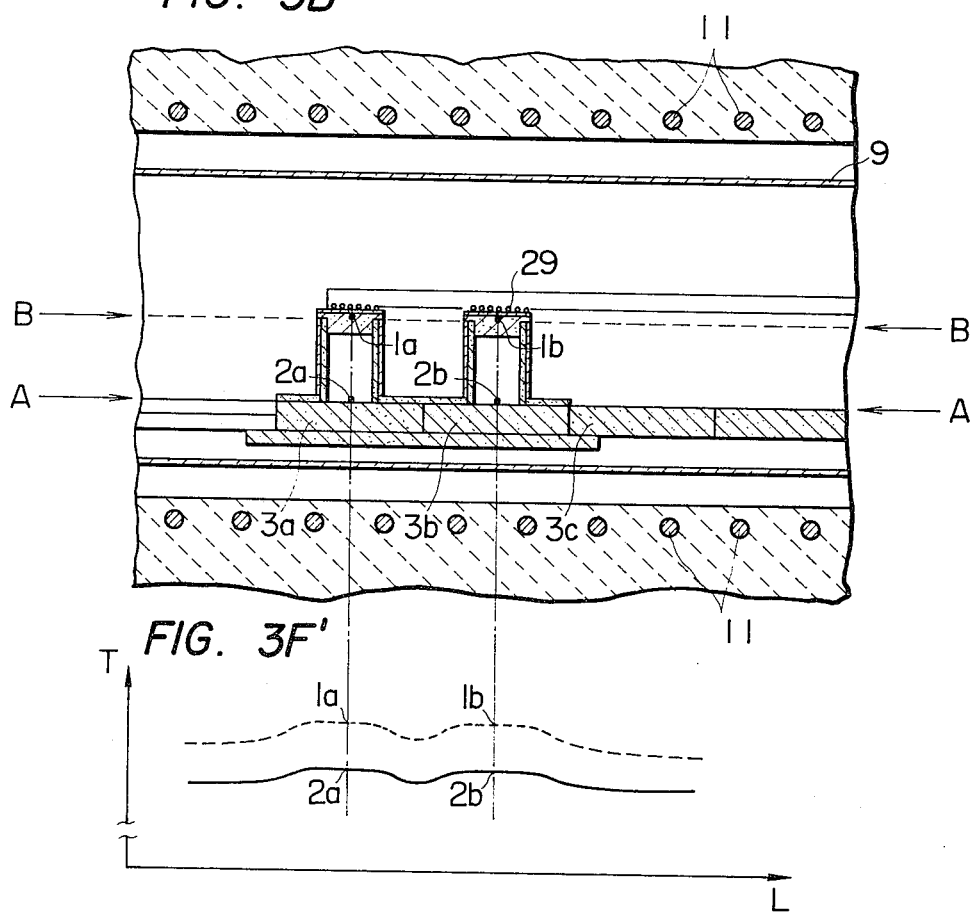
FIG. 3B
FIG. 3F'

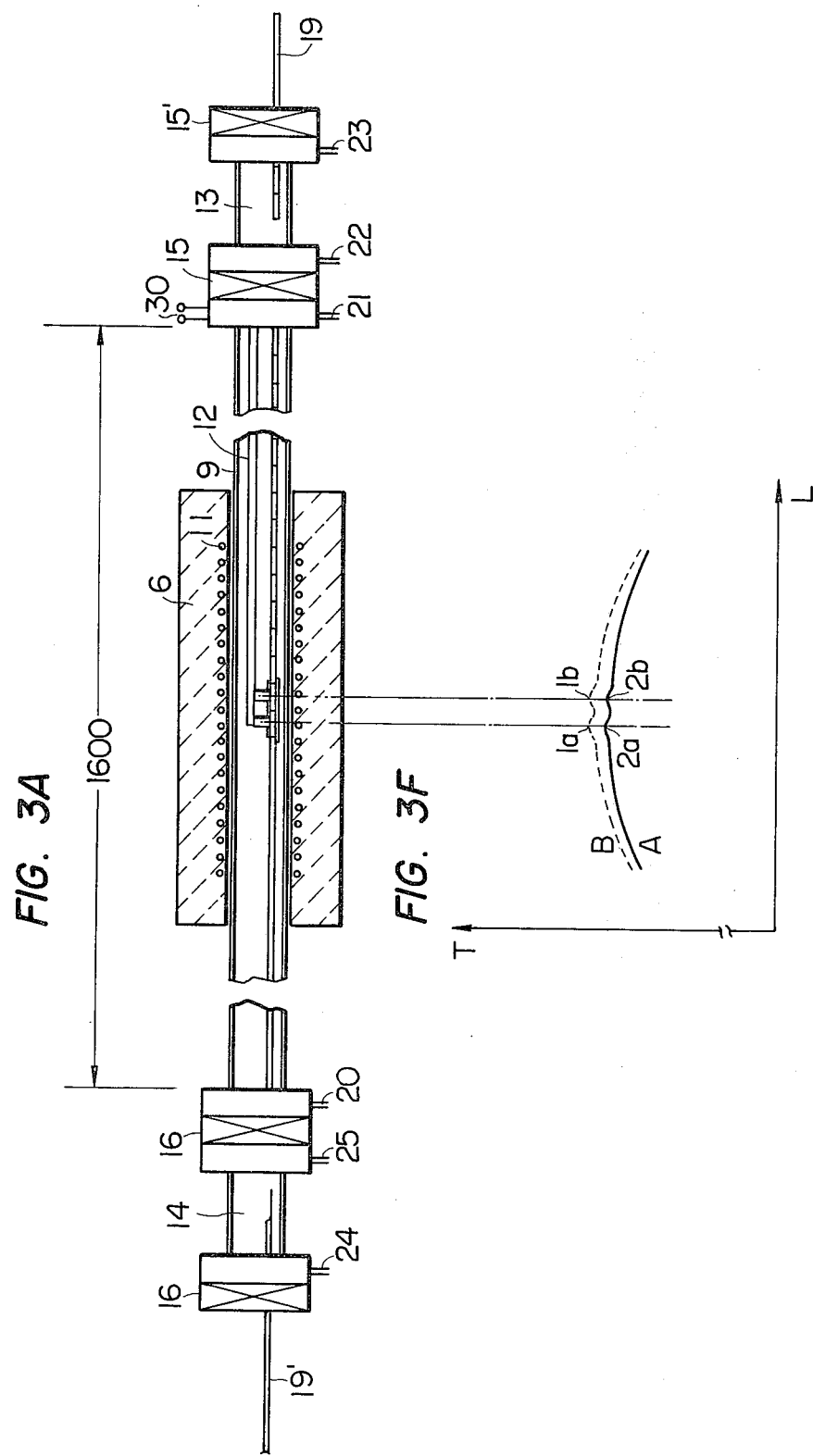

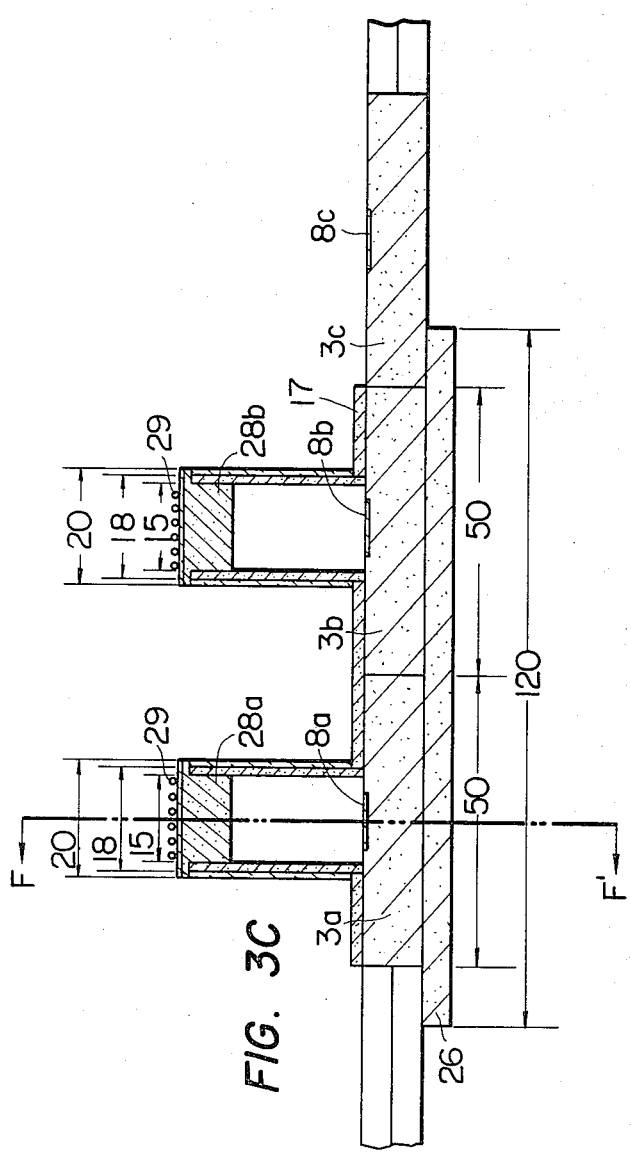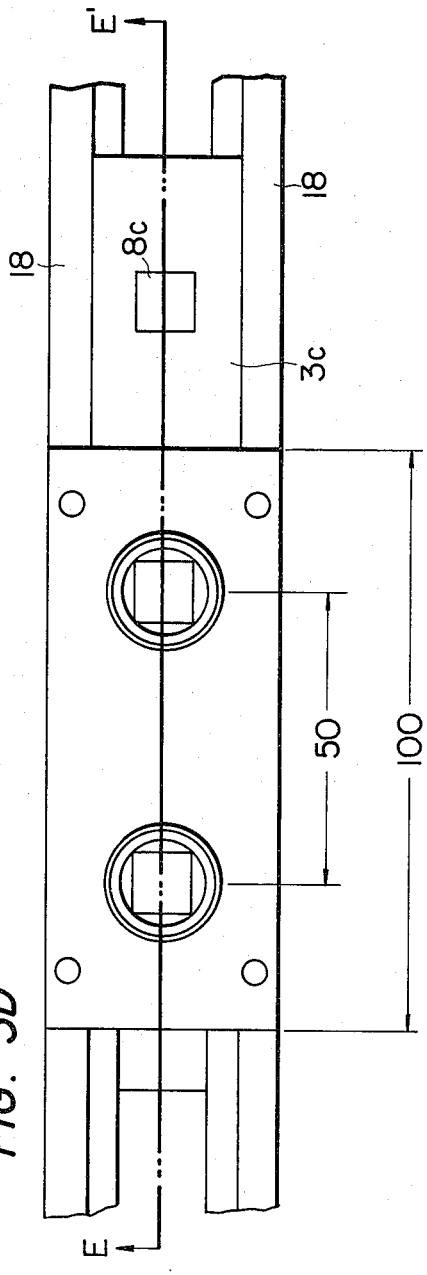

METHOD AND APPARATUS FOR PRODUCING A MULTILAYER SEMICONDUCTOR DEVICE UTILIZING LIQUID GROWTH

CROSS REFERENCE TO RELATED APPLICATION

This is a continuation of my copending application Ser. No. 862,998 filed Dec. 21, 1977, abandoned after the filing hereof, which was a continuation-in-part of Ser. No. 561,092 filed Mar. 24, 1975 abandoned, which in turn was a continuation-in-part of Ser. No. 314,448 filed Dec. 12, 1972 and now abandoned.

BACKGROUND OF THE INVENTION (a) Field of the Invention

The present invention relates to a method and apparatus for producing a semiconductor device by the solution growth technique.

(b) Description of the Prior Art

A number of methods and apparatuses have been proposed heretofore for depositing successive epitaxial layers one after another on a substrate by relying on the solution growth technique. In most of the conventional methods, epitaxial layers of a semiconductive material are deposited from its saturated solution contained in a molten metal solvent by cooling the solution slowly. The cooling of the solution is carried out by reduction of the temperature of a boat provided with some wells or bins or a reservoir in which the solution is contained. After the completion of the deposition of an epitaxial layer, the substrate is displaced from the floor of the well or reservoir to serve as the floor of the next well or reservoir or to a subsequent processing stage by sliding a slide having spaced slots or depressions in which the substrate is to be placed one after another. The resultant cooled well or reservoir must be reheated with a replenishing addition of a small amount of the semiconductive material to resume its same saturated concentration as that at which the previous deposition was commenced, if one wants to deposit an epitaxial layer on another substrate when it arrives underneath the same well or reservoir in order to conduct the deposition under the same conditions as the preceding deposition. Alternatively, if the deposition of an epitaxial layer on another substrate is to be accomplished without such reheating and addition, the temperature of the solution from which the layer is deposited, the deposition speed and the doping level of impurities in the deposited layer will naturally have to be different from those conditions under which a preceding deposition was accomplished. This will mean, however, that the resulting semiconductor devices do not all have the same quality and performance. Moreover, the cooling of the solution for depositing an epitaxial layer will cause a gradual variation of doping level of impurities. This is undesirable if one wants to produce semiconductor devices requiring a sharp or stepwise change in the profile of p-type and n-type impurity concentrations at the interface of a heterojunction.

In order to avoid the disadvantages of reheating and addition as described above, A. A. Bergh et al have proposed a method which includes the isolation of small equal portions of solution from a solution reservoir by means of a pair of sliding members, i.e. an upper sliding member and a lower sliding member as disclosed in U.S. Pat. No. 3,690,965. Bergh et al teach that the temperature reduction may be accomplished by moving the growth chamber provided in the upper sliding member together with its contents into a cooler region and that a depleted solution after the deposition is received in a dump well formed in the lower sliding member. However, this method is somewhat troublesome in the operation of the two sliding members and also in that the apparatus has a complicated structure. Moreover, this method can not avoid gradual variations of the doping level of impurities and composition ratios of semiconductive materials due to cooling of the solution.

It has been proposed to transfer a solute from a source chamber to a growth chamber through a valve as disclosed by Blum et al (see: IBM Technical Disclosure Bulletin 13, No. 10, March 1971, p. 2922-2923). This known method also can not avoid the gradual variations of the doping level of impurities, and composition ratios of semiconductive materials because it accomplishes the deposition of an epitaxial layer by cooling the solution.

SUMMARY OF THE INVENTION

Therefore, an object of the present invention is to provide a method for successively producing semiconductor devices having a highly reproducible quality without cooling and reheating the wells or reservoirs.

Another object of the present invention is to provide a simple apparatus for practicing the method mentioned above, which makes possible a mass production of semiconductor devices by a very simple operation.

It has been found that the above objects may be achieved by a method which establishes a temperature difference between the upper portion and the lower portion of a well containing a solution of semiconductor solute material in a molten metal solvent. The upper portion is at a higher temperature than that of the lower portion. The semiconductive solute material is supplied into the solution through the upper end of the well, and the deposition of an epitaxial layer of the material on a substrate takes place at the lower end. The supplied semiconductive solute material located on the top surface of the solution dissolves and diffuses into the bulk of the solution, whereby it serves to keep the solution in the state of a saturated concentration in the upper portion of the well and a supersaturated concentration in the lower portion at a given temperature. The upper portion of the well is maintained at a predetermined temperature which is higher than that of the lower portion to establish a constant temperature difference between both portions. When an epitaxial layer of a desired thickness is deposited on a substrate, this substrate is then displaced from the lower end by another substrate which arrives next. The displaced substrate is then placed at the lower end of a subsequent well to deposit a further epitaxial layer thereon. In this way, a large number of substrates having a multilayer structure consisting of a desired number of epitaxial layers can be successively produced without any steps assigned for cooling and reheating the wells.

According to the present invention, there is provided an apparatus for practicing the method as described above, which comprises: at least one boat means having a plurality of wells, each of which wells consisting of an upper hole having an open end through which semiconductive materials are supplied into the well, a lower hole having an open end at which the growth of an epitaxial layer takes place and a passage interconnecting both holes and which contains a solution of semiconductive materials; lid means engaging in the upper end of said well; slider means consisting of at least one slider plate and having a plurality of recesses each capable of accommodating a substrate, which slider means can be moved while maintaining the recess-equipped surface thereof in coplanar relation relative to the plane including the open end of the lower hole so that the substrate in the recess can be brought into contact with the solution at the open end; guide means for guiding the movement of said slider means; an enclosure for enclosing an assembly of said boat means, slider means and guide means; and heating means for maintaining said upper hole at a predetermined higher temperature than that of said lower hole so as to establish a temperature difference between said upper hole and said lower hole.

These and other objects, the features as well as the advantages of the present invention will become more apparent from the following detailed description.

BRIEF DESCRIPTION OF THE DRAWINGS

FIG. 1A is a diagrammatic plan view of a major portion of an embodiment of the apparatus for producing a semiconductor device according to the present invention.

FIG. 1B is a diagrammatic longitudinal elevational view of the major portion shown in FIG. 1A.

FIG. 1C is a diagrammatic transverse side view of the major portion shown in FIG. 1A.

FIG. 2A is a diagrammatic plan view of the whole arrangement of the embodiment of the present apparatus shown in FIG. 1A.

FIG. 2B is a chart showing a temperature distribution to be established in the embodiment shown in FIG. 2A.

FIG. 2C is a perspective view of the central portion of the apparatus as shown in FIG. 2A.

FIG. 3A is a diagrammatic cross sectional view of another embodiment of the present apparatus.

FIG. 3B is a partially enlarged cross sectional view of the central portion of the growth stage of the apparatus shown in FIG. 3A.

FIG. 3C is an enlarged cross sectional view of an assembly consisting of a container, guide means, base plate and slider means used in the apparatus shown in FIG. 3A.

FIG. 3D is a plan view of the assembly shown in FIG. 3C.

FIG. 3E is a cross sectional view taken along the line F—F' in FIG. 3C.

FIG. 3F is a sketch of temperature distributions along a line B—B through the centers of the upper open ends and a line A—A through the enters of the deposition ends.

FIG. 3F' is a partially enlarged sketch of the central portion of the sketch of FIG. 3F.

DETAILED DESCRIPTION OF THE PREFERRED EMBODIMENTS

With reference to FIGS. 1A, 1B and 1C, a boat 7 used for performing a method of the present invention has a plurality of holes $1a, 1b, \ldots 1n$ of a high temperature portion, which are respectively interconnected in series with a plurality of holes $2a, 2b, \ldots 2n$ to form a plurality of wells $1, 2, \ldots n$. The holes $1a, 1b, \ldots 1n$ of the high temperature portion are held at temperatures higher than those of the holes $2a, 2b, \ldots 2n$ and at predetermined different levels to facilitate movement of solvents containing solute. At the same time, a solute material prepared beforehand is soaked in each of the holes $1a, 1b, \ldots 1n$ of the high temperature portion to melt it at a substantially saturated concentration at a predetermined temperature. Naturally, the solute diffuses into the solvent and, further, moves together with the solvent due to the level difference. The amount of the solvent is determined by its saturation solubility dependent upon the temperature thereof. The solute in the solvent having reached each of the holes $2a, 2b, \ldots 2n$ is naturally supersaturated, and hence is in a condition for deposition or compound deposition.

Each of slide plates $3a, 3b, \ldots 3n$ sliding over the holes $2a, 2b, \ldots 2n$ has a substrate 8 mounted on its underside, which is fixed at a desired position. As shown in FIG. 1C, the lower surface of slide plate $3n$ accommodates substrate 8 and is substantially coplanar with the open upper end of the second or lower hole $2n$ of the well. When a first one of the substrates is soaked in the solution in a second hole $2a$, the solute is deposited on the surface of the substrate and after satisfactory deposition the slide plate is slid by a guide or the like provided at one end of the jig, so that the substrate is brought to the next hole and soaked again in the solution therein.

At the same time, the subsequent substrate is soaked in the solvent in the first hole, so that a layer is grown on the substrate in the similar manner.

The substrates each having layers thus sequentially grown in the holes $2a, 2b, \ldots 2n$ arranged in sequence are brought to the outside after the growth in the last hole $2n$. The formation of the sequence-arranged holes $2a, 2b, \ldots 2n$ in a block of the same material, for example, carbon is advantageous in that the temperature difference between adjacent holes is held small.

Each of the holes $2a, 2b, \ldots 2n$ has a cover 4 to completely close it for preventing evaporation of the semiconductive materials and the impurities from the solution.

A more concrete example will now be described in reference to FIGS. 2A and 2B.

The boat 7 is formed by carbon, has a size of 20 centimeters (cm) in length by 5 cm by 5 cm and is formed therein the holes or wells $1a, 1b, \ldots 1n$ of the high temperature portion. Each of the holes $1a, 1b, \ldots 1n$ has rectangular configuration as shown, with a length of 2 cm, a width of 2 cm, and depth of 1 cm. The holes $2a, 2b, \ldots 2n$ interconnected respectively with the holes $1a, 1b, \ldots 1n$ of the high temperature portion are each formed in a size of 1 cm by 1 cm by 1 cm. The holes $1a, 1b, \ldots 1n$ of the high temperature portion are held at temperatures higher than those of the holes $2a, 2b, \ldots 2n$ with a predetermined temperature difference of preferably 50° C. or less therebetween respectively. The holes are held at a level difference of 2 cm to facilitate movement of the solvent, for example, Ga containing GaAlAs or GaAs. At the same time, a solute material prepared in advance is soaked in the holes of high temperature portion held at a temperature range of 900° C. to 850° C. For example, GaAs and Al are soaked in the holes $1a$ and $1b$, and GaAs is soaked in the hole $1c$ both for example in a molten solvent Ga. In this case, they are molten in the substantially saturated condition. In the cross-section at the coupling portion of each pair of the holes $1a, 1b, \ldots 1n$ and $2a, 2b, \ldots 2n$, the hole of the high temperature portion has a size of 1 cm in length by 0.8 cm in width, while that of the low temperature portion has a size of 0.8 cm in length by 0.6 cm in width. Further, the size of the cover 4 is 1.95 cm by 1.95 cm by 0.2 cm, and the slide plates $3a, 3b, \ldots 3n$ for example made of carbon have a size of 1.8 cm in width by 1 cm in height by 30 cm in length and formed by carbon. Each of the slide plates 3a, 3b, ... 3n has formed therein a hole or recess having a size of 1.5 cm × 1.5 cm a depth of 0.5 mm for receiving substrate 8. The sliding movement of the aligned slide plate is smoothly achieved along a guide 18 having a size of 0.4 cm in width by 0.4 cm in height, which is provided at one end of a jig (not shown). The slide plates are successively movable right-handwardly, for example, by pushing slide plate 3a at the left end thereof.

The temperature difference mentioned above will be described in more detail below.

In the example of FIGS. 2A and 2B, the growth of three epitaxial layers on a substrate is achieved under temperature distribution of uniform gradients, such that the holes 1a, 1b and 1c of the high temperature portion are held at a temperature region of 900° C. to 850° C. as indicated 1a', 1b' and 1c' and the holes 2a, 2b and 2c are at a temperature range of 850° C. to 800° C. as indicated by 2a', 2b' and 2c' in FIG. 2B showing schematically a temperature distribution in the growth stage of the semiconductor production apparatus used in the present invention shown in FIG. 2A. Though the maximum preferred temperature difference is 50° C., even when such temperature difference of 50° C. is further reduced and no temperature gradient exists, the growth can be effected so long as a temperature difference exists between the holes 1a, 1b, ... 1n and holes 2a, 2b, ... 2n.

However, since the growing speed of the grown layer is dependent upon the temperature difference between each pair of the corresponding holes 1a, 1b, .. . 1n and 2a, 2b, ... 2n, it is necessary to select constant the time for soaking the substrate in the holes 2a, 2b, .. . 2n. Accordingly, when a thick layer is formed in the case of a multilayer construction, the temperature difference is selected large. Therefore, there are some occasions when the holes 1a, 1b, ... 1n of the high temperature portion are held at the same temperature or at largely different temperatures and, in order to prevent thermal conduction between adjacent holes, it is necessary to separate them at a space therebetween or provide an insulating partition wall of quartz or the like of low thermal conductivity. For example, the holes 1a and 1b are spaced in a distance of one milli-meter (mm) apart from each other, while the holes 1b and 1c are spaced in a distance of 1.5 mm apart from each other.

While the concrete example of this invention has been described above, the size of the respective parts, the solute, the solvents and so on may be appropriately determined according to each purpose. In the case of GaAs or a like compound semiconductor, it is desirable to effect separation in an inert gas or nonoxidizing gas atmosphere after evacuation into vacuum or into lower vacuum, so that in the case of such batch type mass production, it is advantageous to achieve the manufacture while passing the substrates through a multi-stage vacuum furnace having a partition wall 10 provided between adjacent ones of continuously arranged stages, each stage having an intake port 3 for receiving an inert or nonoxidizing gas, and an exhaust port 2.

The vacuum furnace includes a conventional continuous quartz tube 9 with each stage between partitions having a size of 50 cm in length and 8 cm in diameter, while conventional tubular resistance furnace 6, for example, of a two shell type as shown in FIG. 26 of the catalog published by Siliconit Konetsu Kogyo, Japan, 1957, is used for heating. FIG. 2C shows a diagrammatic perspective view of the apparatus as shown in FIG. 2A, in which the upper half shell is exaggeratedly spaced apart from the lower half shell in order to make clear the structure of the furnace. In practice, the lower edges of the upper shell are respectively in abutment with the upper edges of the lower shell to form a cylindrical tube. An aluminum wire 11 of a size of 1.8 mm in diameter is wound on a core in each shell of the furnace 6 having an inner diameter of 10 cm and such a temperature distribution as shown in FIG. 2B is used. The substrate crystal is fitted into grooves formed in a nonreactive plate, and it is advantageous to slide the substrate on the surface layer of the member having the holes 2a, 2b, ... 2n arranged in sequence. The solution leaking out from the holes to a drain "d" formed at one end of a slide plate as shown in FIG. 2A in a case where the slide plates 3a, 3b, ... 3n are exchanged over (i.e. moved sequentially into position in resistance furnace 6) can be utilized for renewing the overall solution.

It is preferred that the slide plates 3a, 3b, ... 3n having embedded therein the substrates are moved on wheels or a belt. If the sliding movement of each slide plate on the member having the holes 2a, 2b, ... 2n is initiated, the slide plate is slided by a guide while being fixed in position relative to the member. In this case, the slide plate can be moved by applying mechanical pressure thereto by the subsequent slide plate or a member provided beforehand.

In the case of passing the substrate through a multi-stage vacuum furnace 5, the partitions 10 of the vacuum furnace at the joints between adjacent ones of the slide plates 3a, 3b, ... 3n are asynchronously shut down to hold the vacuum in the respective stages as conventionally known. In this manner, according to the present invention a semiconductor device of multilayer construction can be produced with ease. Furthermore, attachment of electrodes can be readily achieved by using a part of the multi-stage vacuum furnace 5, for example, by using vacuum evaporation in the last stage.

To recapitulate, the following discussion of the foregoing is now given.

With reference to FIGS. 1A, 1B and 1C, boat 7 has a plurality of wells designated as a, b, ... and n. Any one of the wells, e.g. the well "a" has a first hole designated "1a", a second hole designated as "2a" and a passage interconnecting both holes. Similarly, the well "b" has a first hole "1b", a second hole "2b" and a passage interconnecting both holes, and so on. Thus, the well "n" has a first hole "1n," a second hole has an open end of the well, at which semiconductive materials are supplied into a solution contained in this well, and the second hole has an opposite open end of the well, at which an epitaxial layer is deposited on a substrate. The temperature of the first hole is higher than that of the second hole so as to establish a predetermined constant temperature difference between both holes. Semiconductive materials prepared beforehand are supplied at the open end of the first hole into the solution to be soaked. The materials continuously dissolve and diffuse into the bulk of the solution so that they serve to keep the solution in the first hole at a predetermined saturated concentration at a predetermined temperature. The amounts of the solutes are determined by their solubilities at the saturated state at a given temperature. The solutes contained in molten metal solvent are naturally supersaturated at the growth end, and therefore, they can be readily deposited on the substrate.

Slide plate "3n" is placed on a surface of the boat in such a manner that the lower surface of the plate is coplanar with the surface including the open end of the second hole. The slide plate has at least one recess provided in one surface thereof. The recess is capable of accommodating a substrate 8 (see FIG. 1A). In operation, at first the slider 3n accommodating, for example, a plurality of substrates 8a, 8b, . . . and 8n (see FIG. 2A) is caused to slide along an appropriate guide means consisting of a guide 18 and a jig (not shown), for example, by pushing the slide plate at the left end thereof so as to place a substrate 8n at the open end of the second hole 2a. Other open ends 2b . . . and 2n are covered with an extended portion of the slide plate 3n or an appropriate slider which may not necessarily have such recesses. After completion of the growth of an epitaxial layer on the substrate 8n up to a desired thickness, the slide plate is displaced to the righthand side in the Figures so that the substrate 8n is placed at the open end of the second hole 2b, and at the same time the adjacent substrate located on the lefthand side will arrive at the open end of the second hole 2a to be in contact with the solution in the well a. In this way, by selecting the number of a, b, . . . and n in conformity with a desired number of epitaxial layers to be deposited on a substrate, the substrate having the desired number of epitaxial layers formed thereon is removed out from the apparatus after the completion of the growth of an epitaxial layer at the open end of the second hole of the well n.

The boat 7 may advantageously be made of carbon or boronnitride in which case a temperature difference between adjacent holes 1a, 1b, . . . 1n and also between holes 2a, 2b, . . . 2n for example is close to zero.

Although the above explanations have been made with reference to a specific example, sizes of the parts of the apparatus, types of semiconductive materials and so on may be appropriately selected according to desired semiconductor devices to be produced. When a GaAs or a like compound semiconductor device is to be produced, it is desirable to use an inert or non-oxidizing gaseous atmosphere. For example, in operation of the apparatus as shown in FIG. 2A, it should be understood that after the inside of the reaction tube 9 made of quartz has been evacuated, a flow of non-oxidizing gas is maintained through the inside of the reaction tube through parts 2 and 3. The inside of the reaction tube as divided by the four partition walls 10, 10', 10" and 10'" into three stages or chambers, provides a first stage at the left end portion of the tube through which the slide plates are inserted into the tube, a growth stage of reaction chamber where the deposition of epitaxial layers takes place and a last stage through which the produced semiconductor devices are removed off from the tube. The partition walls are operable in such a manner that they can be opened for moving the sliders through the stages and closed after placing the slider in position. The flow of non-oxidizing gas for each stage may be maintained through each pair 2, 3 of inlet and outlet pipes independently of other stages.

It will be apparent from the explanation as described above that the present invention makes possible a mass production of semiconductor devices having a multilayer structure consisting of a plurality of epitaxial layers without any steps assigned for cooling and reheating the boat equipped with wells, which steps have been required according to the prior art. As a result, any one of the epitaxial layers of the semiconductor devices produced according to the present invention has no gradual variation of the doping level of impurities nor variation of the composition ratios of semiconductor materials, which variations are caused due to cooling of the solution.

EXAMPLE

With an apparatus as shown in FIG. 2A, a charge consisting of 30 gr. gallium, 3.0 gr gallium arsenide, 0.1 gr. aluminum and 50 mg. zinc is introduced into a well having first hole 1a and second hole 2a. Another charge consisting of 30 gr. gallium, 1.7 gr. gallium arsenide, 0.2 gr. aluminum and 2 mg. tellurium is introduced into a well having first hole 1b and second hole 2b. Still another charge consisting of 25 gr. gallium, 6 gr. gallium arsenide and 4 mg. tellurium is introduced into a well having first hole 1n and second hole 2n. After evacuating each stage, a flow of high purity hydrogen is maintained through ports 2 and 3 in each stage. By controlling input power for each half shell of a furnace as shown in FIG. 2C, hole 1a is maintained at a temperature of 860° C., hole 2a at 840° C., hole 1b at 865° C., hole 2b at 845° C., hole 1n at 855° C. and hole 2n at 835° C. By successively moving slides at intervals of half an hour, about thirty semiconductor devices each having three layers, i.e., P-type GaAlAs, N-type GaAlAs and N+-type GaAs, on a substrate of P-type GaAs are produced without any additional charge. In this example, a small amount of GaAlAs formed from charged GaAs and Al materials is in a state of being soaked in the solution contained in each of the holes 1a and 1b, while a minor amount of GaAs is in a state of being soaked in the solution contained in the hole 1n.

In the above embodiment, the temperature difference has been discussed regarding the temperatures of the first and second holes. It should be noted, however, that a difference in temperature between the first and second holes inevitably results in a difference in temperature between the open end of the first hole (referred to as "supply end" hereinunder) and the open end of the second hole (referred to as "growth end" hereinunder) of the well. Therefore, it should be said that the present invention is characterized by making possible a mass production of semiconductor devices having a multilayer structure by a solution growth method in which a temperature difference is established between the supply end and the growth end. The well may be of a simpler type, therefore, so long as such a temperature difference is established.

As described above with reference to FIGS. 1A, 1B and 2A, the boat or container may have a gap or a spacer between adjacent wells so that a temperature difference established between the supply end and the growth end of a well can be different from that of the adjacent one. In order to more effectively control the temperature difference, the gap may be made much wider and an auxiliary resistance coil may be provided on the lid of the well.

In another embodiment of the present invention as shown in FIGS. 3A through 3F', a cylindrical electric furnace 6 having a resistance coil 11, which may be of the type as shown in FIG. 2C, is provided for heating a reaction chamber or growth stage 12 inside the reaction tube made of quartz. The reaction tube is partitioned by means of four partition walls or valve means into three stages, that is, the first stage 13 positioned at the right end portion of the tube with two valve means 15' and 15 at the right and left ends of the stage, respectively; the growth stage 12 partitioned with two valve means 15 and 16; and the last stage 14 at the left end portion of the tube with two valve means 16 and 16' at the right and left ends of the stage, respectively. Each stage has a pair of stainless steel pipes interconnected with the inside of the tube at both ends of the stage for evacuating or passing non-oxidizing gas through the stage, i.e., a pair of pipes 23 and 22 for the first stage, 21 and 20 for the growth stage, and 25 and 24 for the last stage. The valve means 15' has an aperture for inserting a quartz rod 19 which can push a slide plate placed on a tongue formed at the tip of the rod. The valve means 16' also has an aperture for inserting a quartz rod 19' which can pull a slide plate placed on the tongue at the tip of the rod. In the growth stage, there is set an assembly consisting of a boat or container 17 made of high purity carbon having two wells a and b, guide means 18 consisting of two L-type rods or runners 18' and a base plate 26. The guide means extends from the valve 15 to the valve 16 and is fixed on the base plate which, in turn, is placed on the inner wall of the tube or fixed on a suitable support (not shown) provided on the bottom of the tube. The container 17 is fixed on the guide means so that the growth end of the well provided in the container is coplanar with the upper surface of the guide means. A cylinder made of quartz engages the outer cylindrical wall of the well. A wire of metal such as Mo, W, Ta or Pt having a low vapour pressure and a high melting point is coiled on a lid 28 provided on the top of the well to form an auxiliary heater 29. The two auxiliary heaters 29 on the lids 28 a and b may be connected in series, and two lead wires may be connected to external contacts 30 at one of the valves, for example the valve 15. The lid 28 is made of carbon.

Slider means consisting of a plurality of slide plates 3a, 3b, 3c and so on made of high purity carbon, each of which has a recess in the upper surface for accommodating a substrate and a cross section of T-type, are movably engaged in the space formed between the two L-type rods or runners 18' of the guide means, so that the upper surface of the slide is coplaner with the upper surface of the guide means and the plane of the growth end, and that the lower of the slide is coplaner with the lower surface of the guide means and the upper surface of the base plate. The recess has an area capable of accommodating a substrate and a depth enough to allow the deposition of epitaxial layers on the substrate. The well has an inside diameter capable of including the horizontally placed substrate.

FIGS. 3C and 3E show the dimensions in mm. of the container, wells, quartz cylinder, guide means, slider means and base plate.

In operation, semiconductive materials are charged in the wells, the growth ends of which are closed with a dummy slide which may not have any recesses. Adjacent to the dummy slide, are provided slider means consisting of a plurality of slide plates placed on the guide means. After closing the valves 15', 15, 16 and 16' and evacuating all the stages, a flow of high purity hydrogen is maintained through a pair of stainless steel pipes provided in each stage independently of other stages. After the growth end has reached a predetermined temperature and after thus a predetermined temperature difference has been established between the growth and supply ends, a slide plate having a substrate in its recess is pushed into the growth stage along the guide means by inserting the rod 19 through opened valve 15 so that the substrate will be brought to a position adjacent to the right end of the slider means, and at the same time therewith a substrate, e.g. 8a accommodated in the recess of the slide plate 3a at the left end of the slider means, arrives just below the growth end of the well b. Then, the rod is removed through the valve means 15 until the tongue of the rod enters into the first stage, and thereafter the valve means 15 is closed. Another slide plate is placed on the tongue of the rod through the valve means 15'. Alternatively, one of the slide plates placed in advance on an appropriate support in the first stage may be placed on the tongue by an appropriate transferring means. After the deposition of a desired thickness of an epitaxial layer on the substrate 8a, the valve means 15 is again opened and the slider plate in the first stage is pushed into the growth stage by inserting the rod so that the substrate 8a is brought just below the growth end of the well a, and the neighboring substrate 8b on the right side thereof will be positioned just below the growth end of the well b. In this way, a semiconductor device having two epitaxial layers on a substrate is produced in the growth stage. The semiconductor device can be removed by the rod 19' from the growth stage through valve means 16 and 16'. The valve means 16 is opened only when the rod 19' is inserted thereinto or removed therefrom. The stage 13 or 14 is reevacuated and re-filled with a flow of hydrogen when oxygencontaining gas enters into the stage.

Referring to FIGS. 3F and 3F', there is shown a sketch of temperature distributions in the growth stage. The solid curve represents temperature variation along a line through the centers of the growth ends, while the dotted curve represents that of the supply ends.

In an example of the operation of the apparatus as shown in FIG. 3A, a temperature difference between the growth end and the supply end is about 15° C. when the temperature of the growth end is about 900° C. The auxiliary heater for each well is composed of a coil having seven turns of a tungsten wire of 0.5 mm. in diameter with lead wires of molybdenum. The auxiliary heaters were operated with input power of 50 watts. Once semiconductive materials were charged into the wells, about 50 to 100 semiconductor devices were produced with a growing speed of 0.2 to 2$\mu$/min. with a hydrogen flowing through the growth stage at a rate of 10 to 100 cm. per minute.

The use of lids 28a and 28b results in preventing evaporation of the solution, thus stabilizing the concentrations of the components in the solution during deposition, and therefore making possible the production of semiconductor devices having the same performance even after producing a large number of devices.

Although the above description has been made mainly with reference to specific embodiments of the present invention, it should be understood that many modifications and alteration can be made within the scope of the present invention.

What is claimed is:

1. An apparatus for producing semiconductor devices by depositing a multi-layer structure on each of a given number of substrates by utilizing liquid growth, comprising:

a boat having a plurality of first holes arranged in sequence thereon and a plurality of second holes which are provided at higher positions than those of the first holes and interconnected by solutes respectively to the first holes during the deposition of epitaxial layers, means for heating the solutes in the second holes to higher temperatures than those of the solutes in the first holes to effect a selected temperature difference in said interconnected first and second holes during and continuously between the deposition of epitaxial layers;

sliding plates coupled to the boat for successively shifting the substrate held thereon on and close to the first holes, and means for guiding said movable plates in only one given direction for a given number of times to grow said multi-layers on a given number of substrates successively and for keeping said substrates contacting said solutions for each of given time intervals.

2. In a method for producing semiconductor devices each having a multi-layer structure including a plurality of epitaxial layers by successively depositing said layers epitaxially on each of a plurality of substrates accommodated in one surface of a movable plate by causing the substrate to contact a solution of a semiconductive solute material in a molten metal solvent contained in a plurality of wells provided in a boat, the improvement which eliminates boat cooling and reheating steps, comprising:

maintaining said upper portion of each said well at a predetermined constant temperature higher than that of said lower portion to effect communication of said solution between said upper and lower portion to establish a constant temperature difference between said upper portion and said lower portion during and continuously between the deposition of said epitaxial layers;

soaking semiconductive solute material in said solution contained in each of said wells to maintain the solution at a saturated concentration in said upper portion of the well and at a supersaturated concentration in said lower portion thereof; and between each of said successive epitaxial layer depositions again moving said movable plate only in the same direction each time while maintaining said temperature difference and substantially coplanar with a lower open end of the lower portion of each said well as the substrates arrive at the open ends for the deposition of contents of the wells onto the respective substrates to form an epitaxial layer thereon.

3. A method according to claim 2 in which said solution is made with a substance selected from the group consisting of gallium-aluminum arsenide and gallium arsenide in a solvent gallium.

4. A method according to claim 2 in which said constant temperature difference between said upper portion and said lower portion is up to 50° C.

5. A method according to claim 2 in which said upper portion is maintained at a temperature of 900° C. to 850° C. and said lower portion is maintained at a temperature of 850° C. to 800° C., and said constant temperature difference between said upper portion and said lower portion is up to 50° C.

6. In a method for producing multi-layer semiconductor devices by depositing successively a plurality of epitaxial layers on each of a plurality of substrates utilizing liquid growth, the improvement which eliminates boat cooling and reheating steps, comprising the steps of:

filling respectively with solutes including corresponding solvents in a plurality of first holes which are arranged in sequence on a boat;

filling respectively with solutes including corresponding solvents in a plurality of second holes which are provided in the boat at lower positions than those of the first holes and interconnected by said solute respectively to the first holes;

holding the solutes in the first holes at respective temperatures higher than those of the solutes in the second holes during and continuously between the deposition of epitaxial layers; and successively shifting in a given direction a substrate held in a sliding plate on and close to a plurality of said second holes while maintaining said respective temperatures.

7. In an apparatus for successively producing semiconductor devices each having a multilayer structure including a plurality of epitaxial layers successively deposited on a substrate, the improvement comprising:

boat means having a plurality of vertically disposed wells corresponding to the desired number of epitaxial layers to be deposited, each said well having an open lower end and an upper end in solution communication with said lower end during the deposition of epitaxial layers;

movable means having a plurality of recesses formed on one surface for accommodating a plurality of substrates therein, said movable means being disposed so that said one surface is brought into substantially coplanar relation successively with the lower open ends of said wells and being movable in one predetermined direction only to successively dispose each of said substrates adjacent each of said lower open ends, with said substrates being kept in contact with said lower open ends respectively for a predetermined time; and means for maintaining the upper portion of each said well at a respective constant predetermined temperature higher than that of the respective lower portion of the well so as to establish a temperature difference between said upper portion and said lower portion of each said well during and continuously between the deposition of epitaxial layers.

8. An apparatus according to claim 7 in which each of said wells includes means defining an upper hole having an open end through which semiconductive solute materials are supplied into said well, means defining a lower hole having an open end at which a deposition of an epitaxial layer takes place, and a passage interconnecting both holes.

9. An apparatus according to claim 7 including lid means for closing the upper ends of said wells and in which said means includes an electric furnace surrounding said enclosure and an auxiliary heater provided on top of each said lid means.

10. An apparatus as in claim 7 including guide means for guiding the movement of said movable means.

11. An apparatus as in claim 10 wherein said movable means includes slider means.

12. An apparatus as in claim 7 including means for preventing evaporation of solution from said wells.

13. An apparatus as in claim 12 wherein said upper end of each said well is open and said preventing means includes lid means for each said well for closing said upper end thereof.

14. An apparatus as in claim 13 wherein said movable means is a movable slider means, and the apparatus includes guide means for guiding the movement of said movable slider means and an enclosure for enclosing said boat means, lid means, slider means and guide means.

15. In a method for producing semiconductor devices each having a multi-layer structure including a plurality of epitaxial layers by successively depositing said layers epitaxially on each of a plurality of substrates accommodated in one surface of a movable plate at spaced positions in a given direction by causing the substrates to contact a solution of a semiconductive solute material in a molten metal solvent container in a plurality of successive wells provided in a boat at the same spacing as said substrates, each well having a lower portion with an open end and an upper portion, an improvement which eliminates boat cooling and reheating steps and comprises:

moving said movable plate in said given direction substantially coplanar with the open ends of the lower portions of said wells to position first and second substrates respectively at the said open ends of second and first wells, holding said upper portions of each said well at respective desired first temperatures, concurrently holding said lower portions of each said well at respective desired second temperatures each of which is lower than the respective first temperature for establishing a respective difference in each said well between its said upper and lower portions to said lower portion thereof during the deposition of an epitaxial layer onto said substrate from that well, soaking semiconductive solute material in the solution contained in each said well to maintain the solution at a saturated concentration in said upper portion thereof and at a supersaturated concentration in said lower portion thereof, concurrently depositing first and second epitaxial layers respectively onto said second and first substrates respectively from said first and second wells by soaking said substrates in said supersaturated solution to grow said first and second layers to respective desired thicknesses before again moving said plate, and thereafter again moving said plate in said given direction substantially coplanar as aforesaid to position said second and first substrates respectively at the said open ends of said second well and a third said well to cause concurrent deposition therefrom of two further epitaxial layers of said multilayer structures in the same manner as aforesaid for said first and second epitaxial layers, said upper and lower portions of all said wells being held at their said first and second temperatures from the beginning of the first epitaxial growth on said first substrate through to the finish of the last epitaxial growth on the last of said substrates to receive a said deposition.

16. A method as in claim 15 including selecting the respective temperature differences established in the successive wells to cause all concurrently grown epitaxial layers to grow to the respective desired thicknesses therefor in the same length of time.

17. In a method for producing identical semiconductor devices each having a multilayer structure including a plurality of epitaxial layers deposited on one of successive substrates accommodated in one surface of a movable plate at spaced positions in a given direction by causing the substrates to contact a solution of a semiconductive solute material in a molten metal solvent contained in a plurality of successive wells provided in a boat at the same spacing as said substrates, each well having a lower portion with an open end and an upper portion, an improvement which eliminates boat cooling and reheating steps and comprises the steps of:

(a) holding said upper portions of each said well at respective desired first temperatures, (b) concurrently holding said lower portions of each said well at respective desired second temperatures each of which is lower than the respective first temperature for establishing a respective difference in each said well between its said upper and lower portions, (c) soaking semiconductive solute material in the solution contained in each said well to maintain the solution at a saturated concentration in said upper portion thereof and at a supersaturated concentration in said lower portion thereof, (d) moving said movable plate in said given direction substantially coplanar with the open ends of the lower portions of said wells to position a set of said substrates at the said open ends of said wells, (e) concurrently depositing epitaxial layers respectively onto the so positioned substrates from the respective wells by soaking said substrates in said supersaturated solutions to grow said layers to respective desired thicknesses in the presence of the said temperature differences in the respective wells before again moving said plate, (f) repeatedly moving said plate in said given direction substantially coplanar as aforesaid to re-position said substrates so that a new set of substrates is at the open ends of said well, and (g) re-effecting step (e) in between said repositioning of said substrates caused by step (f), said upper and lower portions of all said wells being held at their said first and second temperatures from the beginning of the first epitaxial growth on the first of said substrates to receive a said deposition through to the finish of the last of said substrates to receive a said deposition.

18. A method as in claim 17 wherein each of the said temperature differences is 50° C.

19. A method as in claim 17 wherein each of said first temperatures is in the range of 900° C. to 850° C.

20. A method as in claim 19 wherein each of said second temperatures is in the range of 850° C. to 800° C.

21. A method as in claim 17 including selecting at least a plurality of one of said first and second temperatures for respective wells to be substantially the same.

22. A method as in claim 17 including selecting at least two of one of said first and second temperatures for adjacent wells to be sufficiently different to give rise to at least potential thermal conduction between said adjacent wells in said boat.

23. A method as in claim 22 including substantially preventing said thermal conductivity in said boat between said adjacent wells.

24. A method as in claim 23 including spacing the upper portions of said wells in said boat sufficiently to substantially prevent said thermal conduction between those spaced upper portions.

25. A method as in claim 23 including partitioning the upper portions of said wells in said boat to substantially prevent said thermal conduction between those partitioned upper portions.

26. A method as in claim 17 wherein a plurality of the layers deposited from different wells are different in their said desired thicknesses and said temperature differences for all said wells are selected so that all concurrently grown layers are grown to their respective desired thicknesses in the same length of time.

27. A method as in claim 26 wherein the time between said repeated movements of said plate in step (f) is constant.

* * * * *